United States Patent [19]
Yamazaki et al.

[11] Patent Number: 5,476,802
[45] Date of Patent: Dec. 19, 1995

[54] METHOD FOR FORMING AN INSULATED GATE FIELD EFFECT TRANSISTOR

[75] Inventors: Shunpei Yamazaki, Tokyo; Yasuhiko Takemura, Kanagawa, both of Japan

[73] Assignee: Semiconductor Energy Laboratory Co., Ltd., Kanagawa, Japan

[21] Appl. No.: 250,956

[22] Filed: May 27, 1994

Related U.S. Application Data

[63] Continuation of Ser. No. 934,237, Aug. 25, 1992, abandoned.

[30] Foreign Application Priority Data

| Aug. 26, 1991 | [JP] | Japan | 3-238710 |
| Aug. 26, 1991 | [JP] | Japan | 3-238711 |
| Aug. 26, 1991 | [JP] | Japan | 3-238712 |

[51] Int. Cl.$^6$ ............ H01L 21/336; H01L 21/84
[52] U.S. Cl. .............. 437/21; 437/44; 437/186; 437/233
[58] Field of Search ............... 437/21, 41, 44, 437/186, 233, 34, 57; 257/336, 344

[56] References Cited

U.S. PATENT DOCUMENTS

| 3,997,367 | 12/1976 | Yau | 437/44 |
| 4,312,680 | 1/1982 | Hsu | 437/44 |
| 4,366,613 | 1/1983 | Ogura et al. | 437/44 |
| 4,503,601 | 3/1985 | Chiao | 437/44 |
| 4,616,399 | 10/1986 | Ooka | 437/44 |
| 4,701,423 | 10/1987 | Szluk | 437/44 |
| 4,885,259 | 12/1989 | Osinski et al. | 437/44 |
| 4,971,922 | 11/1990 | Watabe et al. | 437/44 |
| 4,978,626 | 12/1990 | Poon et al. | 437/57 |
| 5,139,904 | 8/1992 | Auda et al. | 430/30 |
| 5,146,291 | 9/1992 | Watabe et al. | 437/44 |
| 5,151,374 | 9/1992 | Wu | 437/44 |
| 5,227,321 | 7/1993 | Lee et al. | 437/34 |
| 5,238,859 | 8/1993 | Kamijo et al. | 437/44 |
| 5,362,661 | 11/1994 | Kim | 437/40 TFT |

FOREIGN PATENT DOCUMENTS

| 0197738 | 10/1986 | European Pat. Off. | 437/44 |
| 59-220971 | 12/1984 | Japan | 437/44 |
| 2-162738 | 6/1990 | Japan | 437/44 |
| 5-267331 | 10/1993 | Japan | 437/44 |
| 6-177148 | 6/1994 | Japan | 437/44 |

*Primary Examiner*—Mary Wilczewski
*Attorney, Agent, or Firm*—Sixbey Friedman Leedom & Ferguson; Gerald J. Ferguson, Jr.; Evan R. Smith

[57] ABSTRACT

A method for forming an insulated gate field effect transistor capable of providing shorter channel lengths, said process comprising:

forming on an insulator film having provided on a semiconductor, a portion for establishing a gate therewith in the later steps;

introducing impurities into the semiconductor using said portion as the mask, to thereby establish a first impurity region in a self-aligned manner;

establishing a gate by removing at least the sides of said portion by etching or by oxidizing a surface of said portion or by removing the oxidized surface; and introducing impurities into the semiconductor using said gate as the mask, to thereby establish a second impurity region in a self-aligned manner.

14 Claims, 8 Drawing Sheets

METHOD FOR FORMING AN INSULATED GATE FIELD EFFECT TRANSISTOR

This application is a Continuation of Ser. No. 07/934,237, filed Aug. 25, 1992, now abandoned.

BACKGROUND OF THE INVENTION

1. Industrial Field of the Invention

The present invention relates to a method for forming a high speed insulated gate field effect semiconductor device (transistor) suitable for large-scale integration. The semiconductor device according to the present invention is favorably used in microprocessors, microcontrollers, microcomputers, semiconductor memories (IC memories), etc.

2. Prior Art

Extensive R & D efforts with aim to achieve finer semiconductor devices and higher integration are now in progress. In particular, an outstanding progress has been made in the technology for realizing finer insulated gate field effect semiconductor devices; specifically, in the fabrication of MOSFETs (Metal Oxide Semiconductor type Field-Effect Transistors). The "metal" as used herein refers not only pure metals but also semiconductor materials and alloys thereof with metals, provided that those materials have sufficiently high electric conductivity. Furthermore, the oxide incorporated between the metal and the semiconductor need not always be a pure oxide, and also useful are insulator materials having sufficiently high resistance such as nitrides. Thus, the term "MOS" in a strict sense may not be applied to the cases above, but the term herein is used in a broader meaning in which oxides include nitrides and other insulating materials. In this context, MOSFETs refer to field-effect devices based on the structure described hereinbefore.

Fine MOSFETs are realized by decreasing the width of gates. Decreasing a gate width is equivalent to shortening a channel length. In this manner higher speed is achieved simultaneously with the realization of higher integration, because the carriers can be transferred more rapidly along the channel.

A decrease in the gate width, however, brings about disadvantages known as short channel effects. Particularly important among them is the problem of hot electrons. Let us consider a conventional structure comprising impurity-rich regions, i.e., a source and a drain, and a channel region being doped with an impurity of the other polarity having incorporated therebetween. In such a structure, the electric field at the vicinity of the boundary between the channel region and the impurity-rich regions, which is generated by the potential applied to the source and the drain, increases with decreasing channel length. Thus, a considerably unstable MOSFET is realized as a result.

Figure 2A:
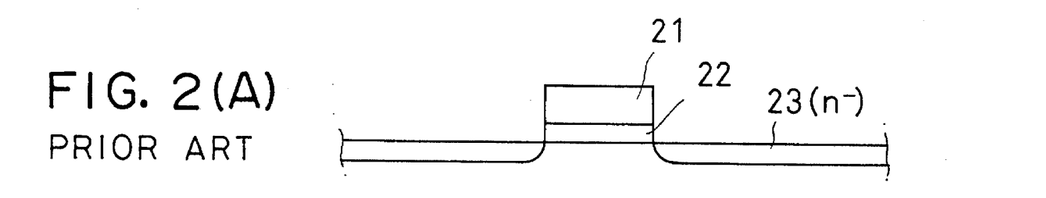
FIGS. 2(A), 2(B), 2(C), and 2(D) show schematically a conventional process for fabricating an LDD structure.
Figure 2B:
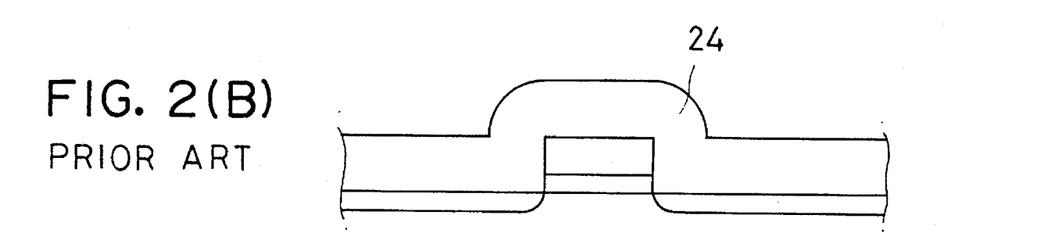
Figure 2C:
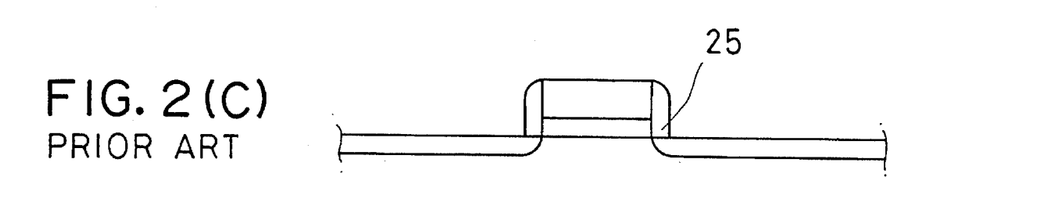
Figure 2D:
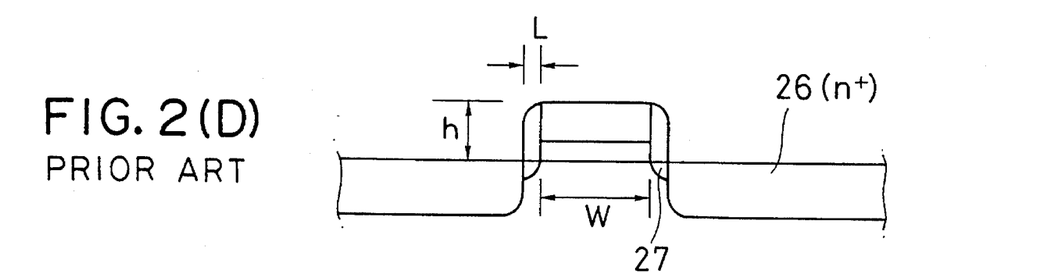

As a solution to this problem, a novel MOSFET structure known as Lightly Doped Drain (LDD) structure is proposed. A typical type of this structure is described below referring to FIG. 2(D). In FIG. 2(D), the LDD region is shown by a region 27 established at a shallower position with respect to an impurity-rich region 26. The electric field at the vicinity of the boundary between the channel and the impurity-rich regions can be decreased by thus providing the LDD region, and thereby devices which operate stabler have been realized.

In general, the LDD regions are established in such a manner shown schematically in FIG. 2. Though the figure is given specifically for an NMOS, PMOS can be fabricated in a similar manner as well. First, an oxide film and then an electrically conductive film are deposited on a p-type semiconductor substrate, and are then etched to give a gate insulator 22 and a gate 21 as shown in FIG. 2(A). Then, an impurity region 23 (an n⁻ region) relatively low in impurity concentration is established by, for example, ion bombarding, in a self-aligned manner using the gate as the mask.

An insulator film 24 such as a PSG film is then deposited subsequently on the structure above. This insulator film 24 is removed thereafter by an anisotropic etching process (known also as orientation dependent etching) such as a biased plasma etching. As a result, a structure as shown in FIG. 2(C) can be obtained, with the PSG remaining unetched on the side of the gate. The PSG residue thus obtained is called a spacer. Then an impurity-rich region (an n⁺ region) 26 is established in a self-aligned manner using the spacer 25 as the mask. The n⁺ impurity region is then used as a source and a drain for the FET.

An LDD structure having established in this manner reportedly shortens a conventionally feasible channel length of 0.5 μm to 0.1 μm.

However, the LDD structure still cannot provide all the solutions to the problems associated with a short-channeled structure. One of such problems which await solution include the resistance of the gate. Certainly the operating speed would be increased by reducing its width, however, this advantage would be easily canceled out by a decrease in transfer speed if the gate has such a high resistivity. To overcome this problem, countermeasures such as using metal silicides low in resistivity in the place of a conventionally used impurity-rich polycrystalline silicon, or running a low-resistance wiring, e.g., an aluminum wiring, in parallel with the gate are proposed and actually employed. Those measures yet require further alternative means as the width of the gate approaches 0.3 μm or less.

As another solution to the problem above, the ratio of the height to the width of the gate, i.e., the aspect ratio, is increased. An increase in the aspect ratio extends the cross sectional area of the gate and thereby reduces the resistivity thereof. However, this measure also has some limitation in the fabrication of the LDD structure, and hence an aspect ratio of a limited value is only available. More precisely, this limitation is due to the fact that the width of the spacer having etched out depends on the height of the gate. In general, a spacer conventionally available has a width of about 20% or more of the height of the gate. Accordingly, if the LDD region 27 in FIG. 2 were to be established at a width L of 0.1 μm, the gate must be provided at a height h of 0.5 μm or less. If the height h of the gate exceeds 0.5 μm, an L of 0.1 μm or larger results. This leads to an unfavorable increase in resistance between the source and the drain.

Suppose a gate having an h of 0.5 μm and a width W of 1.0 μm, and an LDD having a width L of 0.1 μm are established. If this element were to be further scaled down to a width W of 0.5 μm, an h of 1.0 μm must be realized to maintain the same resistivity. With a W of 0.5 μm and an h of 1.0 μm, however, L becomes 0.2 μm. This signifies that the resistance between the source and the drain at an ON state (a state at which a voltage is applied to a gate electrode and the resistance in the channel region is sufficiently lowered with respect to that of the n⁻ region) is doubled in spite of the gate being maintained at a constant resistivity. In such a case, the element is expected to respond at a twice faster speed in correspondence to the channel length which have been halved. However, this advantage is canceled out by the doubled resistance between the source and the drain. Accordingly, an element with a higher integration but with no improvement in the response speed is achieved. On the other hand, if an element having an L being maintained to a conventional value were to be achieved, the gate should be established at an h of 0.5 μm. This again results in a resistance twice as large as before, and hence a quick response cannot be obtained.

In practice, the spacer is provided at a width corresponding to 50 to 100% of the height of the gate. Thus, in a conventional process for fabricating an LDD, the gate is fabricated at an aspect ratio of 1 or lower, and mostly 0.2 or lower. Furthermore, the width for a spacer greatly fluctuates and hence it is the reason why transistors give characteristic values differing from one to another. Thus, it can be seen that a conventional process for fabricating an LDD structure does realize a higher stability in a shorter channel and devices with higher integration and quicker response as a consequence, but is in conflict that the fabrication process itself poses hindrance for a still higher integration and quicker response.

SUMMARY OF THE INVENTION

As mentioned hereinbefore, finer devices inevitably require wirings of higher aspect ratio. Accordingly, the present invention provides a process for readily fabricating a gate having an aspect ratio as high as 1 or more in an insulated gate field effect transistor. Height of the gate electrode having an aspect ratio as high as 1 or more is equal to or more than one time as large as width thereof.

Figure 1A:
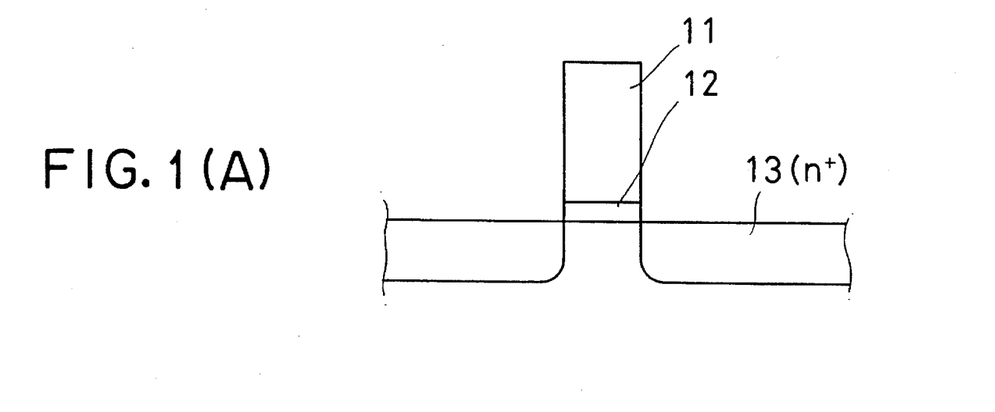
FIG. 1(A) 1(B) and 1(C) shows schematically a process for fabricating an LDD structure according to the present invention.
Figure 1B:
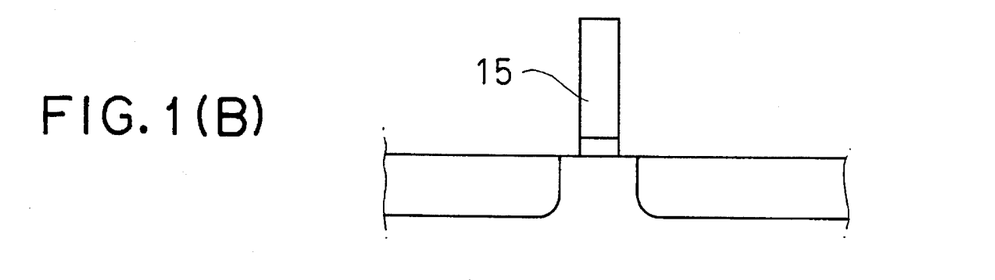
Figure 1C:
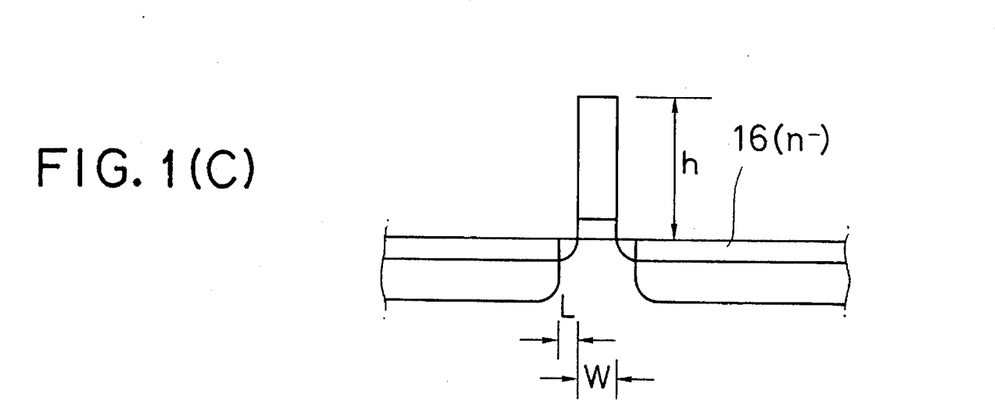

Referring to FIG. 1, a typical embodiment according to the present invention is described. In the present embodiment, reference is specifically made to a type using an NMOS, but a PMOS-type device can be readily realized in a similar manner. First, an oxide film and an electrically conductive film are successively deposited on a p-type semiconductor substrate, which are then etched to give a gate insulator (insulating film) 12 provided on the semiconductor substrate, and a portion 11 which later becomes a gate (referred to simply as a "pre-gate portion", sometimes hereinafter), that is a pattern 11 including a gate electrode therein. Then, by introducing an impurity in the semiconductor substrate with this pre-gate portion 11 as a mask, a first impurity region 13 is established in the semiconductor substrate in a self-aligned manner by an ion-implantation process or the like. Thus is obtained a first impurity region 13 containing impurities at a concentration as high as in the range of from about $1 \times 10^{20}$ to $5 \times 10^{21}$ cm$^{-3}$. This region is represented by n$^+$.

Then, the surface of the pre-gate portion is removed by isotropic etching to obtain a subducted surface. Thus, a gate 15 is obtained as a final structure as shown in FIG. 1(B). It should be taken care in this step so that the etching rate of the gate is maintained higher than that of the semiconductor material. Otherwise, the semiconductor substrate would be largely etched during the formation of the gate. The etching may be carried out either by a wet etching which comprises dipping the substrate into a liquid or by a dry etching in a reactive gas or plasma. For instance, in a structure comprising an aluminum gate on a most commonly used semiconductor material, i.e., silicon, hydrochloric acid is preferably used because aluminum can be readily etched thereby while leaving the silicon substrate intact. However, a process which causes an anisotropic etching should be avoided. For example, a biased plasma etching process, for example, is not suitable for the present invention because at least the side planes of the gate must be also etched.

Furthermore, in accordance with this embodiment, the gate insulator film is removed at the same time with the pre-gate portion. However, the gate insulator film may be left over while carrying out the process. It is again requisite that the gate electrode is etched at a rate sufficiently high as compared to that for etching the gate insulator.

As described in detail above, a second impurity region 16 containing impurities at a low concentration of from $1 \times 10^{17}$ to $5 \times 10^{18}$ cm$^{-3}$ can be established in the semiconductor substrate in a self-aligned manner by introducing an impurity into the semiconductor substrate with the gate electrode 15 as the mask. This region is expressed as an n$^-$ region, and can be formed either by an ion-implantation process or by a process which comprises first depositing a coating containing the impurity elements and then irradiating thereto an electron beam or a laser beam to allow the impurities diffuse from the coating into the underlying structure. The resulting structure is an LDD structure having the same appearance as a one established by a conventional process. (The first impurity region has an impurity concentration higher than the second impurity region.) However, the distinguished feature in the present LDD structure is, as is clearly shown in the figure, that the aspect ratio of the gate can be increased. This is because the width L of the LDD can be set independently to the height of the gate.

Figure 5A:
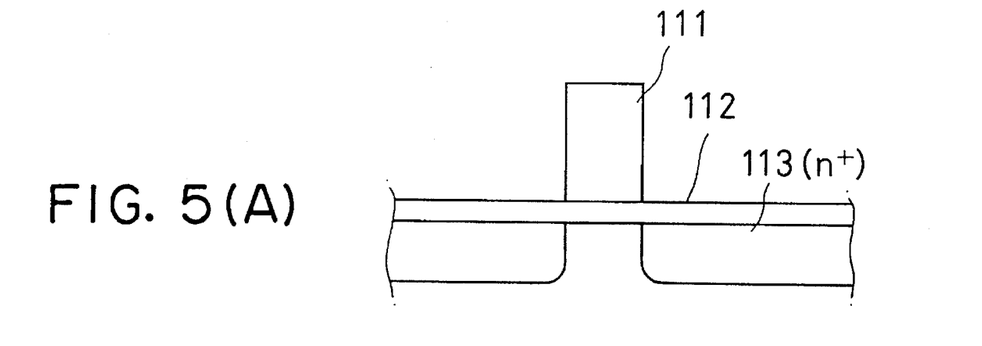
FIGS. 5(A), 5(B), and 5(C) show schematically a process for fabricating an LDD structure according to another embodiment of the present invention.
Figure 5B:
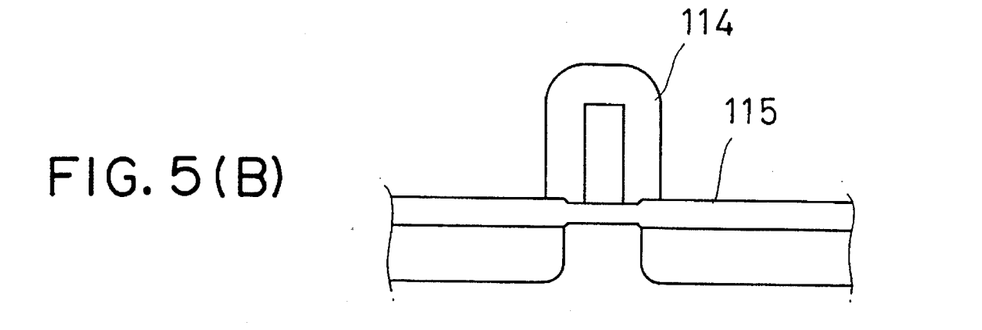
Figure 5C:
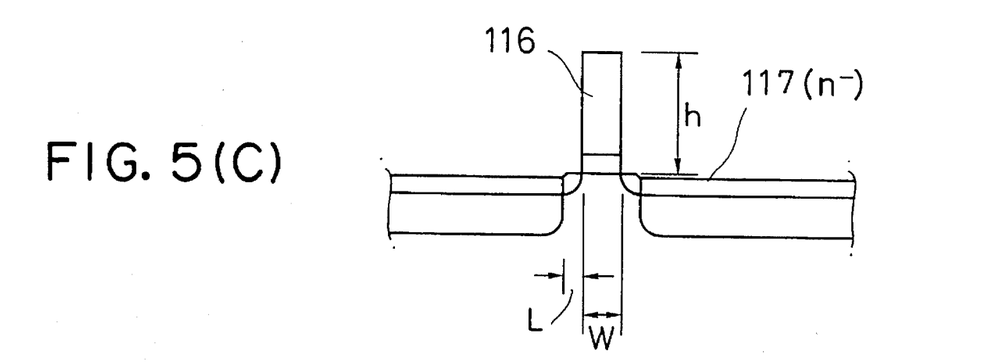

Another typical embodiment according to the present invention is shown in FIG. 5. This embodiment again refers specifically to a type based on NMOS, but a PMOS-type structure can be obtained as well by a similar process. According to this process, an oxide film (insulating film) 112 and an electrically conductive film thereon are first deposited on the surface of a substrate of a p-type semiconductor. The electrically conductive film is then etched to obtain a pre-gate portion (a pattern including a gate electrode therein) 111 as shown in FIG. 5(A). At this point, a part of the oxide film functions as a gate insulator film. Then, a first impurity region 113 expressed by n$^+$ and which contains impurities at a larger concentration from $1 \times 10^{20}$ to $5 \times 10^{21}$ cm$^{-3}$ is formed in the semiconductor in a self-aligned aligned manner by introducing an impurity into the semiconductor with the pattern (the pre-gate portion) as a mask by an ion-implantation process and the like. In this impurity-doping process, the portion which later functions as the gate is used as a mask.

Then, this pre-gate portion used as the mask above is surface-oxidized by a thermal oxidation process. Thus, this pre-gate portion must be made from a material which undergoes oxidation. This process provides a subducted surface on the pre-gate portion to provide a gate. Finally, as shown in FIG. 5(B), a gate 116 is obtained inside an oxide layer 114. For example, in a structure comprising a pre-gate portion 111 made of a polycrystalline silicon and a silicon oxide film 112 being provided as an oxidized film, the silicon substrate is also oxidized via the oxide film 112. However, in this example, the oxidizing rate of the silicon substrate is considerably low as compared with the oxidization rate of the pre-gate portion.

The phenomenon above is due to the decrease in the rate of oxidation with increasing thickness of the initial oxide film. In general, the thermal oxidation of a silicon is known to proceed following an Eqn. (1) below:

$$x^2 - x_0^2 + Ax - Ax_0 = Bt \qquad (1)$$

wherein, A and B are positive constants which depend on the physical properties, crystallographical properties of silicon, etc., such as temperature, crystallographic orientation of the silicon crystal, and the diffusion rates for oxygen atoms and water inside silicon; $x_0$ is the initial thickness of the silicon oxide film; and x is the silicon oxide film thickness after a passage of time t. The following Eqn. (2) can be readily obtained from Eqn. (1):

$$\Delta x(x+x_0+A)=Bt \quad (2)$$

where $\Delta x = x - x_0$.

At a state substantially free of surface silicon oxide coating, $x_0=0$ and hence Eqn. (2) becomes:

$$\Delta X_1 = Bt/(x+A) \quad (3)$$

whereas in a silicon substrate comprising substantially thick oxide film at the initial state and hence $x \approx x_0$, Eqn. (2) can be rewritten as follows:

$$\Delta x_2 = Bt/(2x+A) \quad (4)$$

Other conditions being equal, the oxidation rate can be seen to be larger for Eqn. (3) than for Eqn. (4). That is, the oxidation rate expressed by $\Delta x/t$ is larger for a substrate comprising no surface oxide films at the initial state of oxidation. Though not strictly precise, the oxidation rates for the both cases considered above can be related by the following relation:

$$\Delta x_1/\Delta x_2 = (2x+A)/(x+A) < 2. \quad (5)$$

In fact, in the thermal oxidation of a (100) plane of a single crystal silicon having conducted at 1000° C. for a duration of 100 minutes in dry oxygen under a pressure of 1 atm, a silicon oxide film grows to a thickness of 100 nm if there is substantially no oxide film present at the initial state. In contrast, a substrate having thereon a 100 nm thick silicon oxide film at the initial state of oxidation provides merely a film grown to a thickness of 150 nm under the same condition as above. By simple substitution, it can be seen that in the former case, a film 100 nm in thickness is developed, whereas a film merely 50 nm in thickness is developed in the latter case.

Similarly, a thermal oxidation treatment was carried out at 900° C. for 100 minutes while maintaining the other conditions equal to two substrates differed in the initial oxidized state. Again, it was found that the substrate substantially free of surface oxide film develops a silicon oxide film 50 nm in thickness, whereas the one having thereon initially a 50 nm thick silicon oxide film develops a film merely increased by 20 nm in thickness. Even with a longer heat treatment for a duration of 200 minutes, a 70 nm thick silicon oxide film was found to form on the substrate substantially free of initially oxidized film, whereas a 30 nm thick oxide film was found on the substrate having provided thereon a silicon oxide film 90 nm in thickness prior to thermal oxidation.

Furthermore, the rate of thermal oxidation was found to considerably differ depending on the crystallographic orientation. The oxidation rate in a (100) plane in a single crystal silicon is smaller than any in the planes differing in crystallographic orientation, such as a (111) plane. In a polycrystalline silicon, however, the oxidation rate is about twice as large as that of the (100) plane in single crystal silicon, as a consequence of the surface comprising randomly oriented crystal planes.

As evidenced above and as shown in FIG. 5, a far thicker silicon oxide film can be formed on the pre-gate portion as compared with that which is newly formed on the silicon substrate incorporating therebetween a gate insulator film. Furthermore, the surface of the silicon substrate as viewed in FIG. 5 is sufficiently smooth. For example, if the pre-gate portion 111 made from polycrystalline silicon were to be oxidized for 100 nm deep from the initial surface, the silicon substrate below the oxide film 112 composed of silicon oxide is newly oxidized for an additional 25 nm. A surface irregularity in a small extent as in the present case has no particular problem on the resulting semiconductor element.

The next step comprises removing the oxide layer 114 by an etching process in order to form a remaining portion of the pre-gate portion as a gate electrode. The etching may be carried out either by a wet etching which comprises dipping the substrate into a liquid or by a dry etching in a reactive gas or plasma. For instance, in a structure comprising polycrystalline silicon as the pre-gate portion 111, the surface oxide layer 114 inevitably is a silicon oxide layer, and is efficiently removed using fluoric acid. Because silicon, irrespective to whether it is single crystal or polycrystalline, is left intact in fluoric acid, it is preferred that fluoric acid is used to clearly remove the surface oxide layer to the boundary between the surface oxide layer and the underlying silicon.

Then, a second impurity region 117 containing impurities at a low concentration of from $1 \times 10^{17}$ to $5 \times 10^{18}$ cm$^{-3}$ can be established in the semiconductor in a self-aligned manner by introducing an impurity into the semiconductor using the gate 116 as the mask. This region is expressed as an n$^-$ region, and can be formed either by an ion-implantation process or by a process which comprises first depositing a coating containing the impurity elements and then irradiating thereto an electron beam or a laser beam to allow the impurities diffuse from the coating into the underlying structure. The resulting structure is an LDD structure having the same appearance as a one established by a conventional process. (The first impurity region has an impurity concentration higher than the second impurity region.) However, the distinguished feature in the present LDD structure is, as is clearly shown in the figure, that the aspect ratio of the gate can be increased. This is because the width L of the LDD can be set independently to the height of the gate.

Figure 7A:
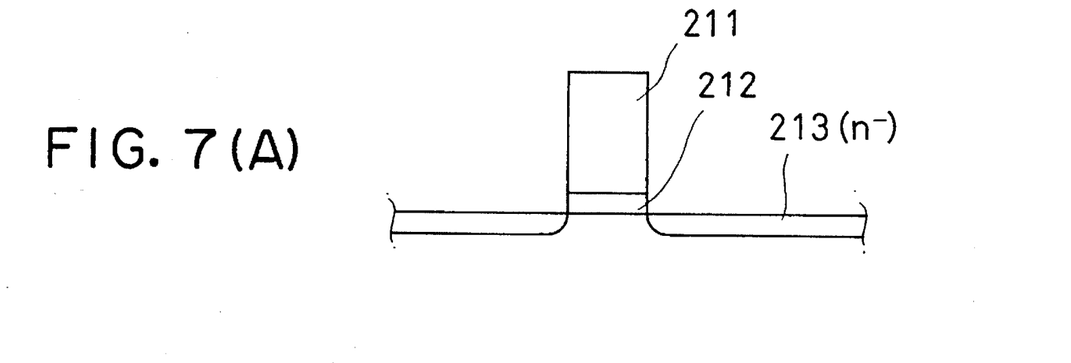
FIGS. 7(A), 7(B), and 7(C) show schematically a process for fabricating an LDD structure according to still another embodiment of the present invention.
Figure 7B:
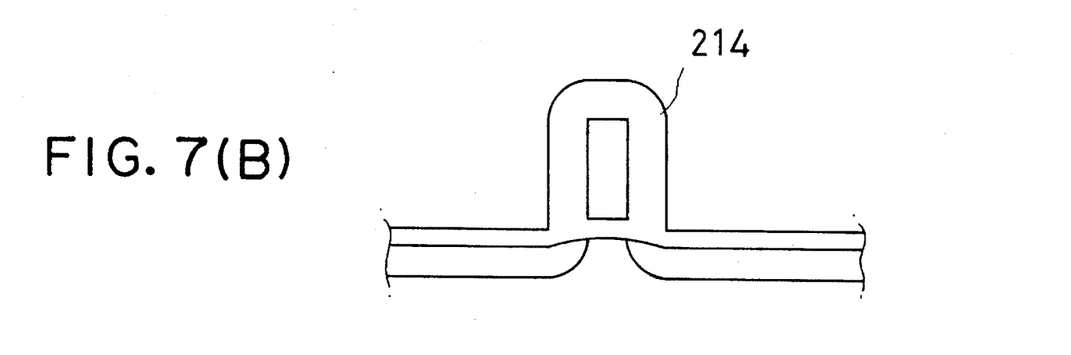
Figure 7C:
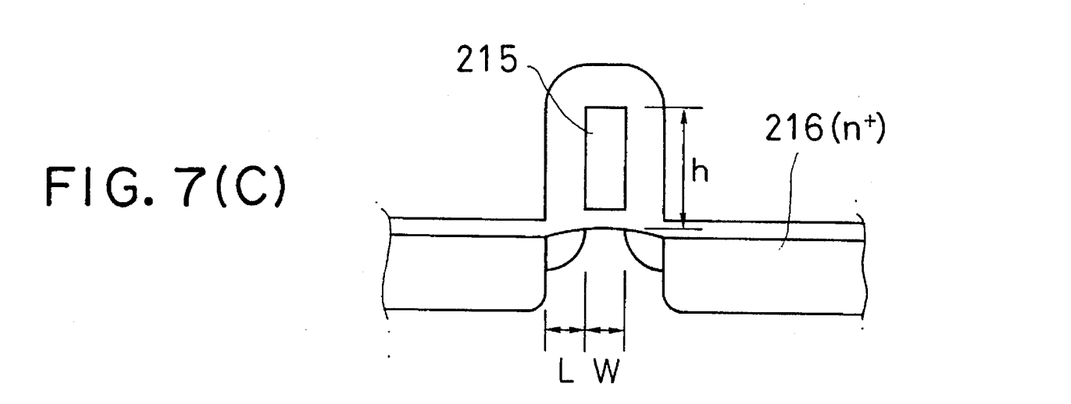

Another typical embodiment according to the present invention is shown in FIG. 7. This embodiment again refers specifically to a type based on NMOS, but a PMOS-type structure can be obtained as well by a similar process. According to this process, an insulator film such as an oxide film and an electrically conductive film thereon are first deposited on the surface of a substrate of a p-type semiconductor. The insulator film and the electrically conductive film are then etched to obtain a pre-gate portion 211 and a gate insulator film 212 as shown in FIG. 7(A). Then, a first impurity region 213 expressed by n$^-$ and which contains impurities at a low concentration of from $1 \times 10^{17}$ to $5 \times 10^{18}$ cm$^{31}$ is formed in the substrate in a self-aligned manner by introducing an impurity into the substrate by, e.g., an ion-implantation, using the pre-gate portion 211 as the mask.

Then, this pre-gate portion used as the mask above is surface-oxidized by a thermal oxidation process in order to form a remaining portion thereof as a gate electrode. Thus, this pre-gate portion must be made from a material capable of undergoing oxidation. This process provides a subducted surface on the pre-gate portion to provide a gate. Finally, as shown in FIG. 7(B), a gate 215 is obtained inside an oxide layer 214. For example, in a structure comprising a pre-gate portion 211 made of a polycrystalline silicon and a silicon oxide film being provided as an oxidized film 212, the silicon substrate is also oxidized via the oxide film. However, in this example, the oxidizing rate of the silicon substrate is considerably low as compared with the oxidization rate of the pre-gate portion if the gate insulator film made of silicon oxide is maintained without being etched simultaneously with the formation of the gate, and if the silicon substrate is covered with a silicon oxide film.

This is achieved because, as illustrated with the Eqns. (1) to (5) above, the oxidation rate is lowered with increasing thickness of the oxide film present at the initial state.

Furthermore, the rate of thermal oxidation was found to considerably differ depending on the crystallographic orientation. The oxidation rate in a (100) plane in the single crystal silicon is smaller than any in the planes differing in crystallographic orientation, such as a (111) plane. In a polycrystalline silicon, however, the oxidation rate is about twice as large as that of the (100) plane in single crystal silicon as a consequence of the surface comprising randomly oriented crystal planes.

As evidenced above and as shown in FIG. 7, a far thicker silicon oxide film can be formed on the pre-gate portion as compared with the silicon oxide film which is newly formed on the silicon substrate incorporating therebetween a gate insulator film. Furthermore, the surface of the silicon substrate as viewed in FIG. 7 is sufficiently smooth. For example, if the pre-gate portion 211 made from polycrystalline silicon were to be oxidized for a depth of 100 nm from the initial surface, the silicon substrate below the oxide film 212 composed of silicon oxide is newly oxidized for an additional 25 nm. A surface irregularity in a small extent as in the present case has no particular problem on the resulting semiconductor element.

In the step of thermal oxidation, the impurity region 213 having established formerly extends by the heat newly applied. Because the present invention aims to obtain a favorable element which functions efficiently as an FET, the front edge of the impurity region thus extended must be geometrically matched with the both ends of the gate.

Then, a second impurity region 218 containing impurities at a high concentration of from $1\times10^{20}$ to $5\times10^{21}$ cm$^{-3}$ can be established in the substrate in a self-aligned manner by introducing an impurity into the substrate with the gate electrode 215 and the oxide layer 214 surrounding it as the mask. This region is expressed as an n$^+$ region. The resulting structure is an LDD structure having the same appearance as a one established by a conventional process. (The first impurity region has an impurity concentration lower than the second impurity region.) However, the distinguished feature in the present LDD structure is, as is clearly shown in the figure, that the aspect ratio of the gate can be increased. This is because the width L of the LDD can be set independently to the height of the gate.

Moreover, the process according to the present invention enables a highly precise control of the width L of the LDD portion. More specifically, the L can be varied arbitrarily in a range of from 10 nm to 0.1 µm. The channel length W in this case can be set at any value 0.5 µm or less. In a conventional process, it was next to impossible to set the width of the LDD portion to 100 nm or less, and the allowable error was about 20%. In contrast, the process according to the present invention enables fabrication of LDD structures at a width in the range of from 10 to 100 nm at an error of about 10%. Such a precise control of L is based on the fact that the etching rate and the etching depth are easily controlled, or that the oxidation rate is readily controlled.

A further advantageous point in the present invention is that the fabrication process is simplified and hence the productivity is improved. This is ascribed to the fact that the step of establishing an insulator film as the spacer is omitted.

DESCRIPTION OF THE PREFERRED EMBODIMENTS

The embodiments of the present invention are explained in further detail below referring to some non-limiting Examples below.

EXAMPLE 1

Referring to FIG. 3, a process for fabricating a CMOS (complementary MOS) FET on a single crystal semiconductor substrate according to the present invention is described below. First, as shown in FIG. 3(A), an n-type well 33, a field insulator 31, a channel stopper (p$^+$-type) 32, n$^+$-type impurity regions 34 and 36, a p$^+$-type impurity region 35, a phosphorus-doped n-type polycrystalline silicon gate (for NMOS) 37, and a phosphorus-doped n-type polycrystalline silicon gate (for PMOS) 38 were established on a p-type single crystal silicon semiconductor substrate using a conventional process for fabricating integrated circuits.

Figure 3A:
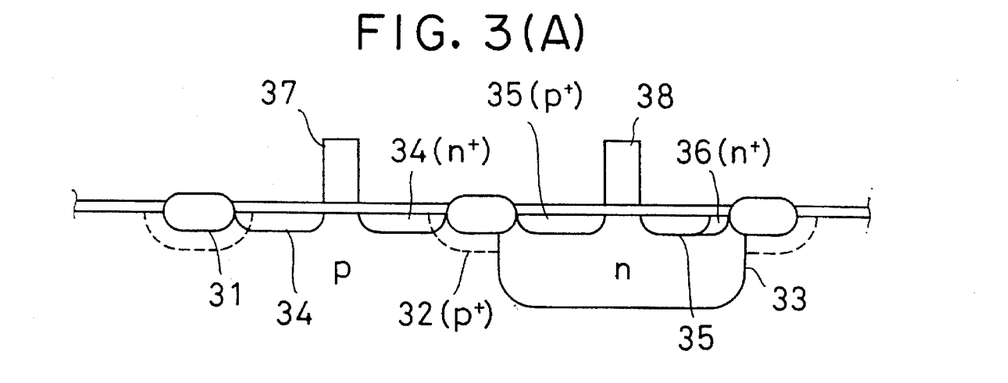
FIGS. 3(A), 3(B), 3(C), and 3(D) show schematically a process for fabricating a CMOS (complementary MOS) device on the surface of a single crystal semiconductor substrate according to an embodiment of the present invention.

The fabrication process is described in further detail below. First of all, a p-type silicon wafer about $10^{15}$ cm$^{-3}$ in impurity concentration was doped with phosphorus ions by injection, and the resulting wafer was then thermally annealed at 1000° C. for a duration of from 3 to 10 hours to allow the phosphorus ion diffuse and redistribute over the whole wafer. Thus was obtained the n-type well 33 containing impurities at a concentration of about $10^{16}$ cm$^{-3}$. Then the channel stopper 32 and the field insulator 31 were obtained by bombarding BF$_2$$^+$ions and by the so-called LOCOS (localized oxidation) process.

Then, by thermal oxidation, a 20 nm thick gate insulator film (silicon oxide film) was formed on the structure obtained above, and the pre-gate portions 37 and 38 were established using polycrystalline silicon containing phosphorus at a concentration of $10^{21}$ cm$^{-3}$. The gate insulator film at this point should not be patterned. Arsenic ions were then implanted thereafter using the pre-gate portions and, if necessary, optionally other masking materials as the masks, to thereby establish n$^+$-type impurity regions 34 and 36 containing impurities at a concentration of $10^{21}$ cm$^{-3}$. Further thereafter, BF$_2$ $^+$ions were implanted to obtain +a p$^+$-type impurity region 35 containing impurities at a concentration of $10^{21}$ cm$^{-3}$. These impurity regions were then activated by annealing them at 900° C. for 1 hour to provide source and drain regions. Thus was obtained a structure as shown in FIG. 3(A).

Figure 3B:
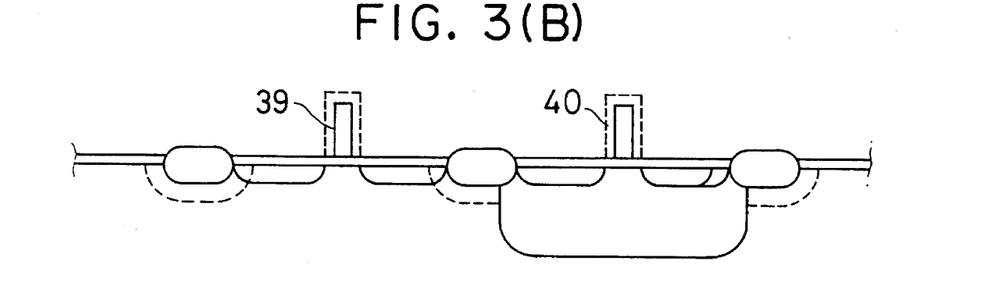

The pre-gate portions were then etched as shown in FIG. 3(B) using a high frequency plasma etching process. The etching was carried out using carbon tetrafluoride (CF$_4$) gas having added therein 60% chlorine as the reactive etching gas, under a pressure of 5 Pa and at a high frequency power output of 0.2 W/cm$^2$. In this manner the side and the upper surfaces of the pre-gate portion can be etched precisely at any thickness between 10 nm and 0.1 μm, for instance, 50 nm. Thus were obtained a gate 39 for the NMOS and a gate 40 for the PMOS.

A phosphorus pentaoxide (P$_2$O$_5$) film 41 and a boron oxide (B$_2$O$_3$) film 42 were then provided by either a chemical vapor deposition (CVD) process or a coating process and patterned. If the film were to be formed by a CVD process, a gas mixture prepared by adding oxygen gas to phosphine (P$_3$) or diborane (B$_2$H$_6$) is pyrolyzed to obtain a phosphorus pentaoxide film and a boron oxide film. If a coating process were to be employed, a paste is prepared first by adding fine-grained silica to phosphorus pentaoxide or boron oxide, and the resulting paste is applied to the surface using a spin coater.

Figure 3C:
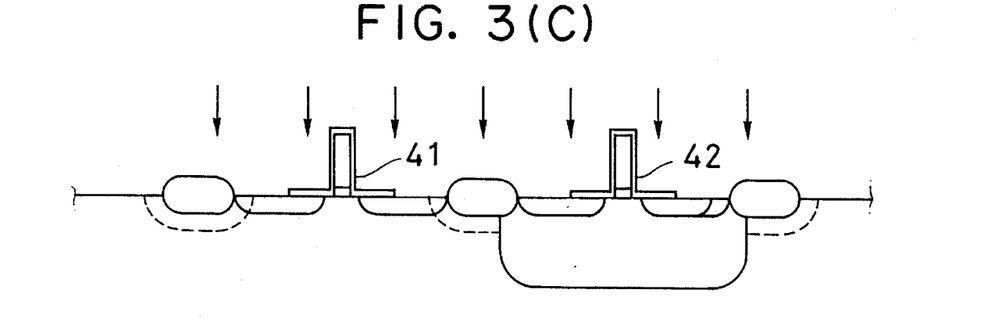

To the resulting structure was then irradiated an excimer laser beam, e.g., a KrF laser beam 248 nm in wavelength and 10 nsec in pulse width, as shown in FIG. 3(C). Thus were the impurity elements diffused from the film coating into the silicon substrate. Because an ultraviolet light is largely absorbed by silicon, the use of an ultraviolet-emitting laser such as an excimer laser enables formation of impurity regions at a considerably shallow region. It should be noted, however, that ion-doping with laser beams is not useful for a precise control of the impurity concentration; hence, conventional doping processes using ion implantation may be employed as well. In the present doping process using a laser beam, the upper surface of the gate 40 is doped with boron. Obviously, however, the influence of the doped boron on the whole gate is extremely little. Thus were obtained an n$^-$-type impurity region 43 and a p$^-$-type impurity region 44.

Finally, a phosphosilicate glass layer 45 was established in a manner similar to a conventional process to obtain an interlayer insulator. The phosphosilicate glass layer can be formed by, for example, a low pressure CVD process. The process can be carried out by reacting starting gas materials of monosilane (SiH$_4$), oxygen (O$_2$), and phosphine (PH$_3$) at a temperature of 450° C.

Figure 3D:
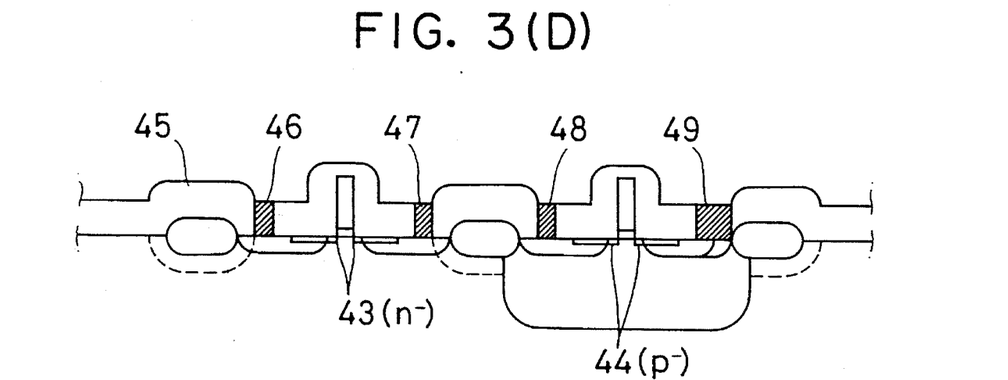

A complementary MOS device as shown in FIG. 3(D) was obtained finally by perforating contact holes in the interlayer insulator film, and then establishing therein aluminum contacts.

EXAMPLE 2

Referring to FIG. 4, a process for fabricating two NMOS thin film transistors (referred to simply hereinafter as "TFTs") on an insulator substrate according to the present invention is described below. First, a silicon oxide layer 52 as a passivation film from 50 to 300 nm in thickness was deposited by, e.g., a sputtering process, on an insulator substrate 51 made from synthetic quartz and the like. Otherwise, a CVD process may be used as an alternative process for depositing the film.

An amorphous silicon layer was further deposited thereon by a plasma-assisted CVD or a low pressure CVD process to a thickness of from 10 to 100 nm, e.g., 20 nm. The thus deposited amorphous silicon layer was patterned into an island-like structure, and a silicon oxide film to give a gate insulator film was further deposited thereon by plasma-assisted CVD to a thickness of from 10 to 100 nm, e.g., 60 nm. A subsequent thermal annealing at 600° C. for a duration of from 12 to 72 hours allows the amorphous silicon crystallize and reduces the number of trap levels in the silicon oxide film.

Figure 4A:
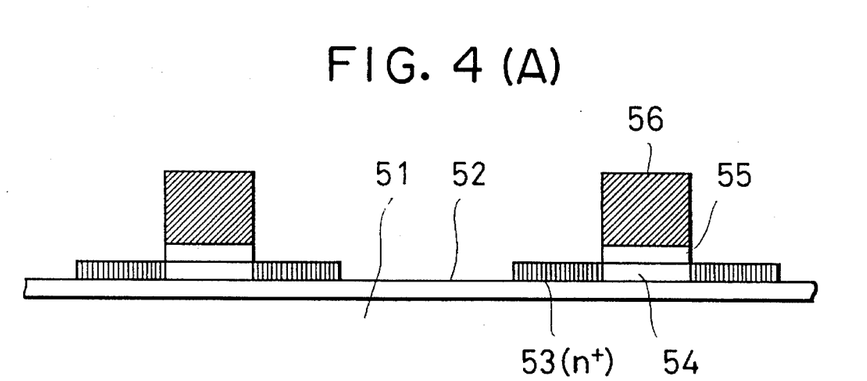
FIGS. 4(A),4(B),4(C), and 4(D) show schematically a process for fabricating an NMOS device on the surface of an insulator substrate according to another embodiment of the present invention.

Then, an aluminum film is deposited for a thickness of, e.g., 500 nm. The thickness of this aluminum coating is determined taking into account the electric conductivity required in the gate wiring. The aluminum film thus obtained and the silicon oxide film were then etched by a known lithographic process to obtain a pre-gate portion 56 and a gate insulator film 55. The pre-gate portion here is established at a width of from 100 to 500 nm, preferably in a range of from 200 to 500 nm, e.g., 400 nm. Then arsenic ions were implanted into the island-like silicon layer according to a known ion-implantation process using the pre-gate portion 56 as a mask. Thus was obtained a structure comprising an n$^+$-type impurity region 53 and a channel region 54 as shown in FIG. 4(A).

Figure 4B:
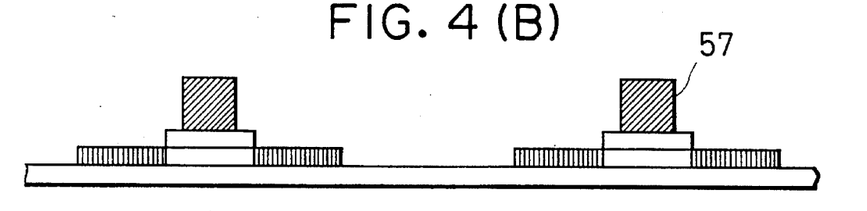

Then, as shown in FIG, 4(B), the pre-gate portion is etched using a high frequency plasma etching process. The etching was carried out using carbon tetrachloride (CCl$_4$) gas as the etching gas, under a pressure of 5 Pa and at a high frequency power output of 0.2 W/cm$^2$. In this manner the side and the upper surfaces of the pre-gate portion can be etched precisely at any thickness between 10 nm and 0.1 μm, for instance, 60 nm. Thus was obtained a gate 57 for the NMOS device.

Figure 4C:
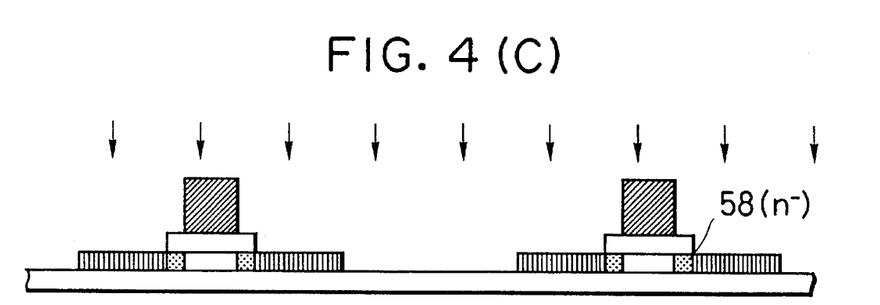

The structure thus obtained was then subjected to a known ion implantation process as shown in FIG. 4(C) to establish an n$^-$-type impurity region 58 in a self-aligned manner using the newly established gate 57 as the mask. Because the impurity regions 53 and 58 thus obtained are considerably reduced in crystallinity, the structure is then subjected to a laser annealing process using an excimer laser to recover the crystallized state. The use of an excimer laser is effective because the pulses are shot repeatedly at a duration as short as 10 nsec. In applying such short pulses, the impurities cannot move by thermal diffusion and hence the blurring of the boundary for the impurity regions is avoided. Particularly, in a case as the present one, in which the LDD region 58 is provided at a mere 60 nm in width, a lamp annealing process used in a conventional process for fabricating semiconductor circuits is not preferred because the impurity ions diffuse during the annealing.

Figure 4D:
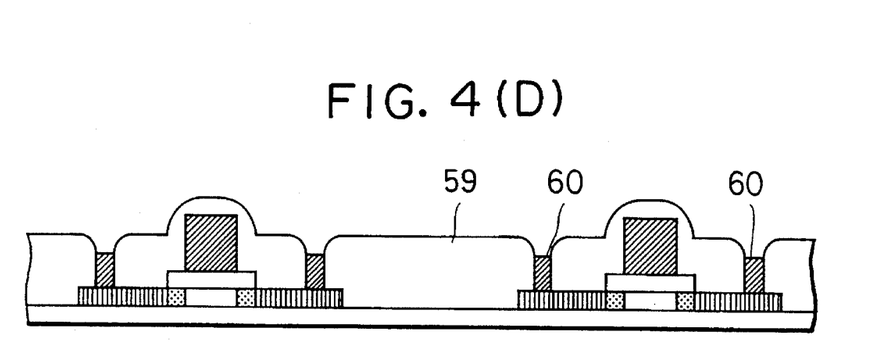

Finally, a phosphosilicate glass layer 59 was established as an interlayer insulator by a low pressure CVD process. Thus was obtained finally an NMOS TFT as shown in FIG. 4(D) by providing thereto contacts 60.

EXAMPLE 3

Referring to FIG. 6, a process for fabricating a CMOS (complementary MOS) FET on a single crystal semiconductor substrate according to the present invention is described below. First, as shown in FIG. 6 (A), an n-type well 133, a field insulator 131, a channel stopper (p⁺-type) 132, n⁺-type impurity regions 134 and 136, a p⁺-type impurity region 135, a phosphorus-doped n-type polycrystalline silicon gate (for NMOS) 137, and a phosphorus-doped n-type polycrystalline silicon gate (for PMOS) 138 were established on a p-type single crystal silicon semiconductor substrate using a conventional process for fabricating integrated circuits.

Figure 6A:
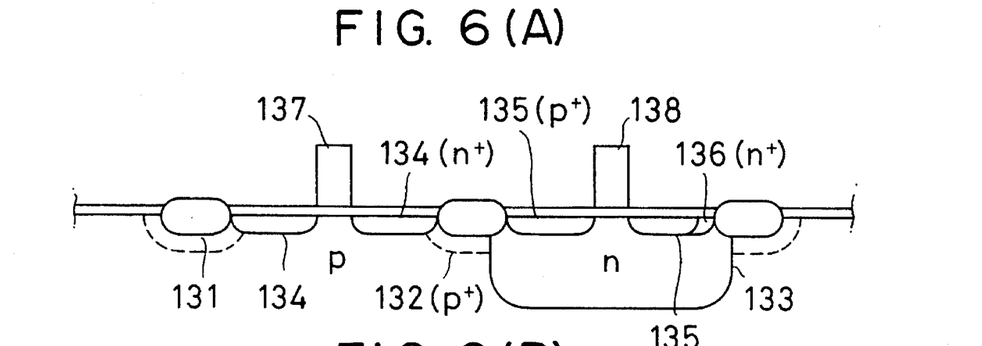
FIGS. 6(A), 6(B), 6(C), and 6(D) show schematically a process for fabricating a CMOS (complementary MOS) device on the surface of a single crystal semiconductor substrate according to another embodiment of the present invention.

The fabrication process is described in further detail below. First of all, a p-type silicon wafer about $10^{15}$ cm⁻³ in impurity concentration was doped with phosphorus ions by ion-implantation and the resulting wafer was then thermally annealed at 1000° C. for a duration of from 3 to 10 hours to allow the phosphorus ion diffuse and redistribute over the whole wafer. Thus was obtained the n-type well 133 containing impurities at a concentration of about $10^{16}$ cm⁻³. Then, the channel stopper 132 and the field insulator 131 were obtained by bombarding $BF_{2+}$ ions and by the so-called LOCOS (localized oxidation) process.

Then, by thermal oxidation, a 70 nm thick gate insulator film (silicon oxide film) and, by a low pressure CVD process, a 500 nm thick polycrystalline silicon film containing phosphorus at a concentration of $10^{21}$ cm⁻³ were formed on the structure obtained above. Thus pre-gate portions 137 and 138 were established by patterning the polycrystalline silicon film above. The gate insulator film at this point was not patterned. Arsenic ions were implanted thereafter using the pre-gate portions and, if necessary, optionally other masking materials as the masks, to thereby establish n⁺-type impurity regions 134 and 136 containing impurities at a concentration of $10^{21}$ cm⁻³. Further thereafter, $BF_2^+$ ions were implanted to obtain a p⁺-type impurity region 135 +containing impurities at a concentration of $10^{21}$ cm⁻³. These impurity regions were then activated by annealing them at 900° C for 1 hour to provide source and drain regions. Thus was obtained a structure as shown in FIG. 6(A).

Figure 6B:
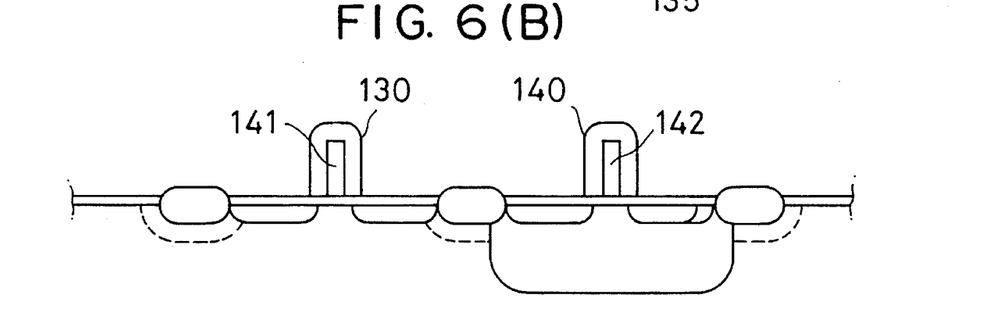

The pre-gate portions were then oxidized as shown in FIG. 6(B) using a thermal oxidation process. The oxidization was carried out, for example, at 800° C. for 500 minutes under a pressure of 1 atm in dry oxygen. By thus carrying out thermal oxidation, the side and the upper surfaces of the pre-gate portion can be coated with silicon oxide films 139 and 140 each about 100 nm in thickness, with the gates 141 and 142 being buried therein. After the oxidization step, the silicon surface of the pre-gate portion was obtained subducted by about 50 nm and the surface of the silicon substrate was also obtained descended by about 10 nm. However, such a subtle change is not only difficult to observe but also has no influence in device characteristics; hence, the change is not apparently shown in the Figure.

The oxide layers 139 and 140, as well as the gate insulator films and the like were then etched by dipping the whole substrate into a 10% by weight fluoric acid for 10 minutes. After sufficiently drying the etched substrate, a phosphorus pentaoxide ($P_2O_5$) film 143 and a boron oxide ($B_2O_3$) film 144 were provided on the surface of the substrate by either a chemical vapor deposition (CVD) process or a coating process and patterned. If the film were to be formed by a CVD process, a gas mixture prepared by adding oxygen gas to phosphine ($PH_3$) or diborane ($B_2H_6$) is pyrolyzed to obtain a phosphorus pentaoxide film and a boron oxide film. If a coating process were to be employed, a paste is prepared first by adding fine-grained silica to phosphorus pentaoxide or boron oxide, and the resulting paste is applied to the surface using a spin coater.

Figure 6C:
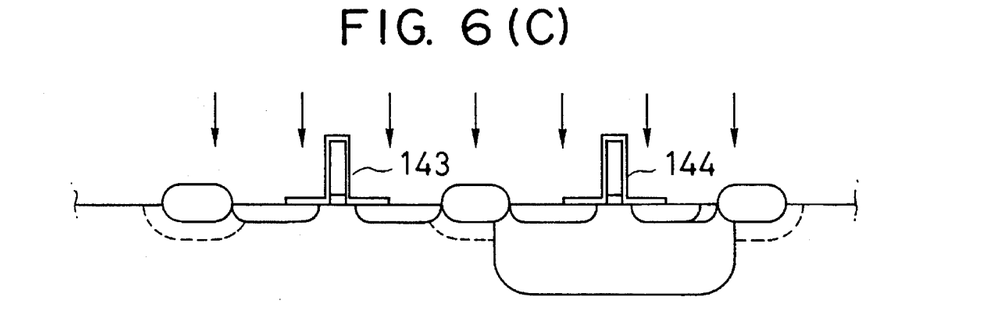

To the resulting structure was then irradiated an excimer laser beam, e.g., a KrF laser beam 248 nm in wavelength and 10 nsec in pulse width, as shown in FIG. 6(C). Thus were the impurity elements diffused from the film into the silicon substrate. Because an ultraviolet light is largely absorbed by silicon, the use of an ultraviolet-emitting laser such as an excimer laser enables formation of impurity regions at a considerably shallow region. It should be noted, however, that ion-doping with laser beams is not useful for a precise control of the impurity concentration; hence, conventional doping processes using ion implantation may be employed as an alternative. In the present doping process using a laser beam, the upper surface of the gate 140 is doped with boron. Obviously, however, the influence of the doped boron on the whole gate is extremely little. Thus were obtained an n⁻-type impurity region 145 and a p⁻-type impurity region 146.

Finally, a phosphosilicate glass layer 147 was established in a manner similar to a conventional process to obtain an interlayer insulator. The phosphosilicate glass layer can be formed by, for example, a low pressure CVD process. The process can be carried out by reacting starting gas materials of monosilane ($SiH_4$), oxygen ($O_2$), and phosphine ($PH_3$) at a temperature of 450° C.

Figure 6D:
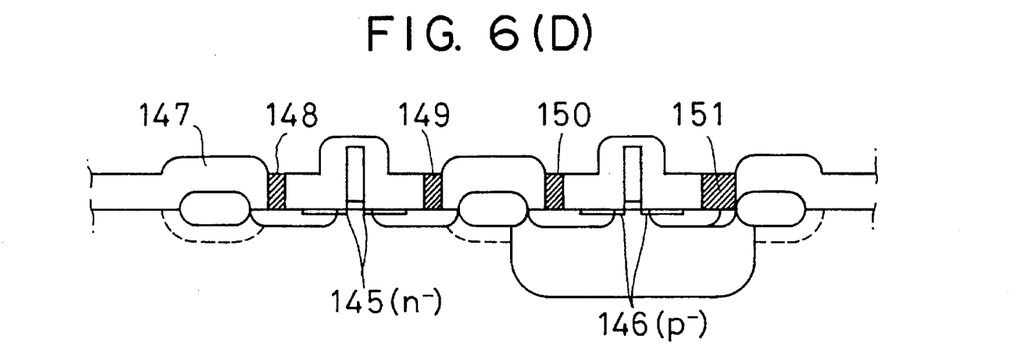

A complementary MOS device as shown in FIG. 6(D) was obtained finally by perforating contact holes in the interlayer insulator film, and then establishing aluminum contacts 148 to 151.

EXAMPLE 4

Referring to FIG. 8, a process for fabricating a CMOS (complementary MOS) FET on a single crystal semiconductor substrate according to the present invention is described below. First, as shown in FIG. 8 (A), an n-type well 232, a field insulator 230, a channel stopper (p⁺-type) 231, an n⁻-type impurity region 234, an n⁺-type impurity region 236, a p⁺-type impurity region 233, a p⁻-type impurity region 235, a phosphorus-doped n-type polycrystalline silicon gate (for NMOS) 237, and a phosphorus-doped n-type polycrystalline silicon gate (for PMOS) 238 were established on a p-type single crystal silicon semiconductor substrate using a conventional process for fabricating integrated circuits.

Figure 8A:
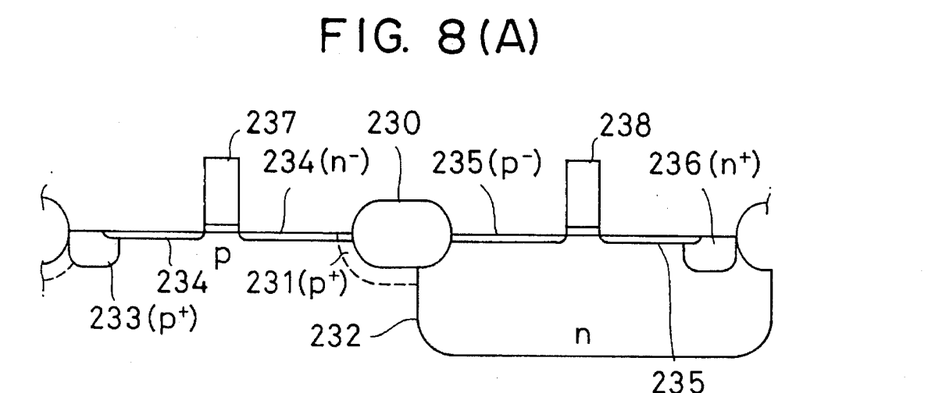
FIGS. 8(A), 8(B), 8(C), and 8(D) show schematically a process for fabricating a CMOS (complementary MOS) device on the surface of a single crystal semiconductor substrate according to still another embodiment of the present invention.

The fabrication process is described in further detail below. First of all, a p-type silicon wafer about $10^{15}$ cm⁻ in impurity concentration was doped with $BF_{2+}$ ions by ion-implantation, and the resulting wafer was then subjected to a so-called LOCOS (local oxidation) process to obtain the channel stopper 231 and the field insulator 230. Then phosphorus ions were implanted to the resulting structure and annealed at 1000° C. from 3 to 10 hours to allow the phosphorus ions diffuse and redistribute over the whole wafer. Thus was obtained the n-type well 232 containing impurities at a concentration of about $10^{16}$ cm⁻³.

Then, by thermal oxidation, a 70 nm thick gate insulator film (silicon oxide film) and, by a low pressure CVD process, a 500 nm thick polycrystalline silicon film containing phosphorus at a concentration of $10^{21}$ cm⁻³ were formed on the structure obtained above. Thus the pre-gate portions 237 and 238 were established by patterning the polycrystalline silicon film above. Arsenic ions were then implanted into the substrate with the pre-gate portions as masks to thereby establish n⁺-type impurity region 236 containing impurities at a concentration of $10^{21}$ cm⁻³. Further thereafter, $BF_2^+$ ions were implanted to obtain a p⁺-type impurity region 233 containing impurities at a concentration of $10^{21}$ $cm^{-3}$. These impurity regions were again subjected to ion implantation using the pre-gate portion and, if necessary, optionally other masking materials as the mask, to thereby obtain an n⁻-type impurity region 234 containing impurities at a concentration of $10^{18}$ $cm^{-3}$ and a p⁺-type impurity region 235 containing impurities at a concentration of $10^{18}$ $cm^{-3}$ by implanting BF$_2$ ions therein. The impurity regions 234 and 235 were provided at a thickness of 20 nm. These impurity regions were then activated by annealing them at 900° C. for 1 hour to provide source and drain regions. Thus was obtained a structure as shown in FIG. 8(A).

Figure 8B:
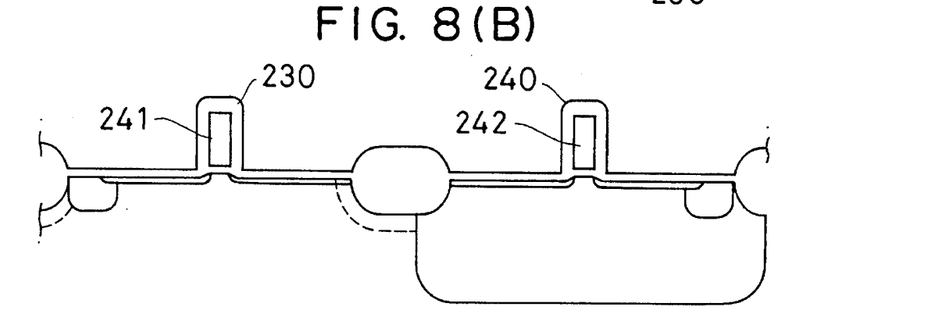
Figure 8C:
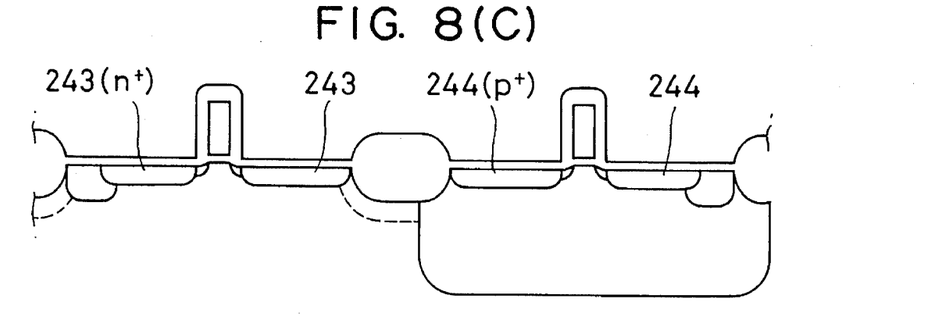

The pre-gate portions were then oxidized as shown in FIG. 8(B) using a thermal oxidation process in order to form remaining portions thereof as gate electrodes. The oxidization was carried out, for example, at 800° C. for 500 minutes under a pressure of 1 atm in dry oxygen. By thus carrying out thermal oxidation, the pre-gate portion can be coated with silicon oxide films 239 and 240 each about 100 nm in thickness, with the gates 241 and 242 being buried therein. After the oxidization step, the silicon surface of the pre-gate portion was obtained subducted by about 50 nm; the surface of the silicon substrate was also obtained descended by about 10 nm. However, such a subtle change is not only difficult to observe but also has no influence in device characteristics.

Then, an n⁺-type impurity region 243 and a p⁺-type impurity region 244 were fabricated in the substrate by introducing an impurity into the substrate with the oxidized portions and the gate electrodes as masks by using an ion-implantation process again. Both impurity regions were provided at an impurity concentration of about $1\times10^{21}$ $cm^{-3}$ and at a depth of 100 nm.

Figure 8D:
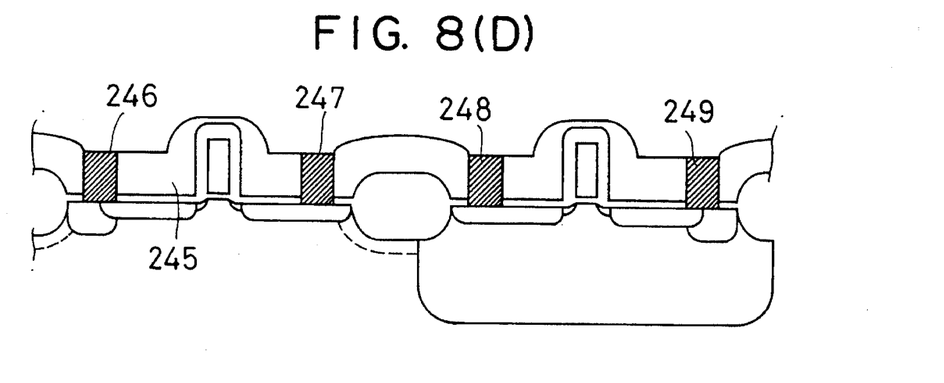

Finally, a phosphosilicate glass layer 245 was established in a manner similar to a conventional process for fabricating an integrated circuit, to thereby obtain an interlayer insulator. The phosphosilicate glass layer can be formed by, for example, a low pressure CVD process. The process can be carried out by reacting starting gas materials of monosilane (SiH$_4$), oxygen (O$_2$), and phosphine (PH$_3$) at a temperature of 450° C.

Thus was finally obtained a complementary MOS device as shown in FIG. 8(D) by perforating contact holes in the interlayer insulator film, and then establishing aluminum contacts 246 to 249.

As described in detail above, the present invention enables fabrication process for LDD-structured MOSFETs considerably reduced in limitations. Thus, as mentioned earlier, LDD portions can be established freely in a width range of from 10 to 100 nm at a high precision and yet independent to the aspect ratio of the gates. Thus, the process according to the present invention is particularly effective for future devices, because more R & D efforts are now placed for the fabrication of devices comprising gates of higher aspect ratio which realize shorter channels.

Needless to say, the present invention is readily applicable to the conventional gates having lower aspect ratios of 1 or less. By applying the present invention to the fabrication of an LDD structure, the steps of forming insulator films and anisotropically etching it thereafter can be eliminated. Furthermore, the LDD structure can be provided at a precisely controlled width. Hence, a distinct effect can be provided also in a conventional process for fabricating devices equipped with gates of low aspect ratios.

The present invention was described taking mainly silicon based semiconductor devices as examples. However, the fabrication process according to the present invention is not only limited to those above, and it is apparent to one skilled in the art that it can be applied to other semiconductor devices based on other materials such as germanium, silicon carbide, and gallium arsenide. Furthermore, the oxidization characteristics of the gate plays an important role. Accordingly, in addition to the silicon gates to which principal references were made in the description above, gates made from tungsten, molybdenum, chromium, aluminum, as well as silicides, carbides, etc., thereof can be favorably used. While detailed descriptions were made specifically on MOSFETs having fabricated on a single crystal semiconductor substrate, other thin film transistors (TFTs) comprising single crystal or polycrystalline semiconductor films on insulator substrates such as quartz and sapphire can be effectively fabricated by the process according to the present invention.

While the invention has been described in detail and with reference to specific embodiments thereof, it will be apparent to one skilled in the art that various changes and modifications can be made therein without departing from the spirit and scope thereof.

What is claimed is:

1. A method for forming an insulated gate field effect transistor having a gate electrode, comprising the steps of:

forming a conductive material on an insulating film provided on a semiconductor;

forming a first impurity region in said semiconductor by introducing an impurity into said semiconductor with said conductive material as a mask with an upper surface of said conductive material directly exposed to said impurity;

removing a portion of said conductive material after forming the first impurity region in order to form a remaining portion thereof as said gate electrode; and forming a second impurity region in said semiconductor subsequent to said removing step by introducing an impurity into said semiconductor with said formed gate electrode as a mask with an upper surface of said gate electrode directly exposed to said impurity.

2. The method of claim 1 wherein height of said gate electrode is more than one time as large as width of said gate electrode.

3. The method of claim 1 wherein said first impurity region has an impurity concentration higher than said second impurity region.

4. The method of claim 1 wherein said first impurity region forming step is carried out in a self-aligning manner.

5. The method of claim 1 wherein said second impurity region forming step is carried out in a self-aligning manner.

6. The method of claim 1 wherein said first impurity region has an impurity concentration of $1 \times 10^{20}$ to $5 \times 10^{21}$ $cm^{-3}$.

7. The method of claim 1 wherein said second impurity region has an impurity concentration of $1 \times 10^{17}$ to $5 \times 10^{18}$ $cm^{-3}$.

8. A method for forming an insulated gate field effect transistor comprising the steps of:

forming a pattern including a gate electrode therein on an insulating film provided on a semiconductor;

forming a first impurity region in said semiconductor by introducing an impurity into said semiconductor with said pattern as a mask;

oxidizing a portion of said pattern after forming said first impurity region;

removing the oxidized portion in order to form a remaining portion thereof as said gate electrode; and forming a second impurity region in said semiconductor after removing said oxidized portion by introducing an impurity into said semiconductor with said gate electrode as a mask.

9. The method of claim 8 wherein height of said gate electrode is more than one time as large as width of said gate electrode.

10. The method of claim 8 wherein said first impurity region has an impurity concentration higher than said second impurity region.

11. A method for forming an insulated gate field effect transistor comprising the steps of:

forming a pattern including a gate electrode therein and comprising a polycrystal silicon on an insulating film provided on a single crystal silicon;

forming a first impurity region in said single crystal silicon by introducing an impurity into said single crystal silicon with said pattern as a mask;

oxidizing a portion of said pattern by thermal oxidation after forming said first impurity region;

removing the oxidized portion in order to form a remaining portion thereof as said gate electrode; and forming a second impurity region in said single crystal silicon after removing said oxidized portion by introducing an impurity into said single crystal silicon with said gate electrode as a mask.

12. The method of claim 11 wherein height of said gate electrode is more than one time as large as width of said gate electrode.

13. The method of claim 11 wherein said first impurity region has an impurity concentration higher than said second impurity region.

14. A method for forming an insulated gate field effect transistor comprising the steps of:

forming a conductive material on an insulating film provided on a semiconductor;

forming a first impurity region in said semiconductor by introducing an impurity into said semiconductor with said conductive material as a mask with an upper surface of said conductive material directly exposed to said impurity;

removing a portion of said conductive material by etching in order to form a remaining portion thereof as a gate electrode; and forming a second impurity region in said semiconductor by introducing an impurity into said semiconductor with said gate electrode as a mask with an upper surface of said gate electrode directly exposed to said impurity.

* * * * *